United States Patent
Han

(10) Patent No.: US 10,229,743 B1
(45) Date of Patent: Mar. 12, 2019

(54) MEMORY DEVICE READ TRAINING METHOD

(71) Applicant: Integrated Silicon Solution, Inc., Milpitas, CA (US)

(72) Inventor: SungJin Han, San Jose, CA (US)

(73) Assignee: Integrated Silicon Solution, Inc., Milpitas, CA (US)

( * ) Notice: Subject to any disclaimer, the term of this patent is extended or adjusted under 35 U.S.C. 154(b) by 0 days.

(21) Appl. No.: 15/703,744

(22) Filed: Sep. 13, 2017

(51) Int. Cl.
G11C 16/26 (2006.01)
G11C 16/08 (2006.01)

(52) U.S. Cl.
CPC .............. *G11C 16/26* (2013.01); *G11C 16/08* (2013.01)

(58) Field of Classification Search
CPC ................................ G11C 16/26; G11C 16/08
USPC .................................................... 365/185.24
See application file for complete search history.

(56) References Cited

U.S. PATENT DOCUMENTS

| 7,038,953 | B2 | 5/2006 | Aoki | |
|---|---|---|---|---|
| 7,443,741 | B2 | 10/2008 | Butt | |
| 9,105,327 | B2 | 8/2015 | Prakash | |
| 2007/0008791 | A1* | 1/2007 | Butt | G11C 7/1006 365/193 |
| 2012/0300564 | A1* | 11/2012 | Dreps | G06F 13/1689 365/193 |
| 2014/0307514 | A1* | 10/2014 | Prakash | G11C 7/222 365/193 |
| 2017/0287535 | A1* | 10/2017 | Lee | G11C 7/14 |

* cited by examiner

*Primary Examiner* — Fernando Hidalgo
(74) *Attorney, Agent, or Firm* — Innovation Counsel LLP

(57) ABSTRACT

A memory device implements a memory read training method using a dedicated read command to retrieve training data from a register for performing memory read training while the memory device remains operating in the normal operation mode. Subsequent to the memory read training, the memory device may then receive the normal read command to read data from the memory cell array or the normal write command to write data to the memory cell array. In this manner, memory read training is performed simply by issuing read commands and carrying out read operations without requiring the memory device to enter and exit special memory read training mode for performing calibration.

13 Claims, 3 Drawing Sheets

MEMORY DEVICE READ TRAINING METHOD

BACKGROUND OF THE INVENTION

Conventional memory systems include a memory controller configured to control memory access to one or more memory devices, such as DRAMs, SRAMs, or Flash memory devices. Memory systems often employ a data strobe signal (DQS) to accompany the read data signal (DQ) being transmitted between the memory controller and the memory device to indicate the point at which the data signal should be sampled or captured. In a memory read operation from the memory device, the memory device drives the data strobe signal and provides the read data on the data signal lines. In particular, during a read operation, the memory device drives the data strobe signal to a logical low level for a preamble period. The read data is provided after the preamble period and the data strobe signal then toggles with the read data. When reading data from the memory device, the data strobe signal edge transitions at the same time as the read data transitions. That is, the data strobe signal generated by the memory device in a read operation is edge-aligned with the data. The memory controller uses the data strobe signal as a reference signal to capture the read data being provided on the data signal lines whereby the data strobe signal is delayed to the center of read data to maximize the valid data window.

In a typical memory system, the memory controller communicates with the memory device over traces formed on the PCB board. The signals transmitted between the memory controller and the memory device are subjected to latency due to the physical layout, the distance of the signal trances and other factors. As a result, there could be delay skew between the data strobe signal and the read data signals from the memory device due to variation in the propagation delays of the signal lines. As received by the memory controller, the data strobe signal and the read data signal transitions may no longer line up. As clock frequencies increases, the delay variation between the data strobe signal and the read data becomes more problematic and may result in the memory controller capturing invalid data or missing capture of valid read data.

Memory read training is a technique often employed in memory systems including high speed memory devices. Memory read training is performed to enable the memory controller to determine the delay offset to use for communicating with the high speed memory device. In particular, memory read training is performed to determine the delay offset the memory controller should use so that the data strobe signal and the data signal are aligned at the memory controller. Memory read training is performed using a predefined read data sequence ("training data") that is stored in a register of the memory device instead of the memory cell array. In conventional memory systems, memory read training is performing by placing the memory device in a dedicated training mode instead of the normal memory read operation mode. The memory controller writes to certain predefined register to cause the memory device to enter into the training mode and to read the predefined read data sequence from the register, instead of reading data from the memory cell array. With the predefined read data sequence thus provided, the memory controller sweeps the data strobe signal over a given delay range to determine a delay offset or a range of delay offset values where the expected read data sequence can be captured. After obtaining the appropriate delay offset values, the memory controller then writes to the predefined register to cause the memory device to exit the training mode. After exiting the training mode, the memory device can then resume normal operation with writing and reading data to and from the memory cell array.

BRIEF DESCRIPTION OF THE DRAWINGS

Various embodiments of the invention are disclosed in the following detailed description and the accompanying drawings.

DETAILED DESCRIPTION

Figures 1, 2:
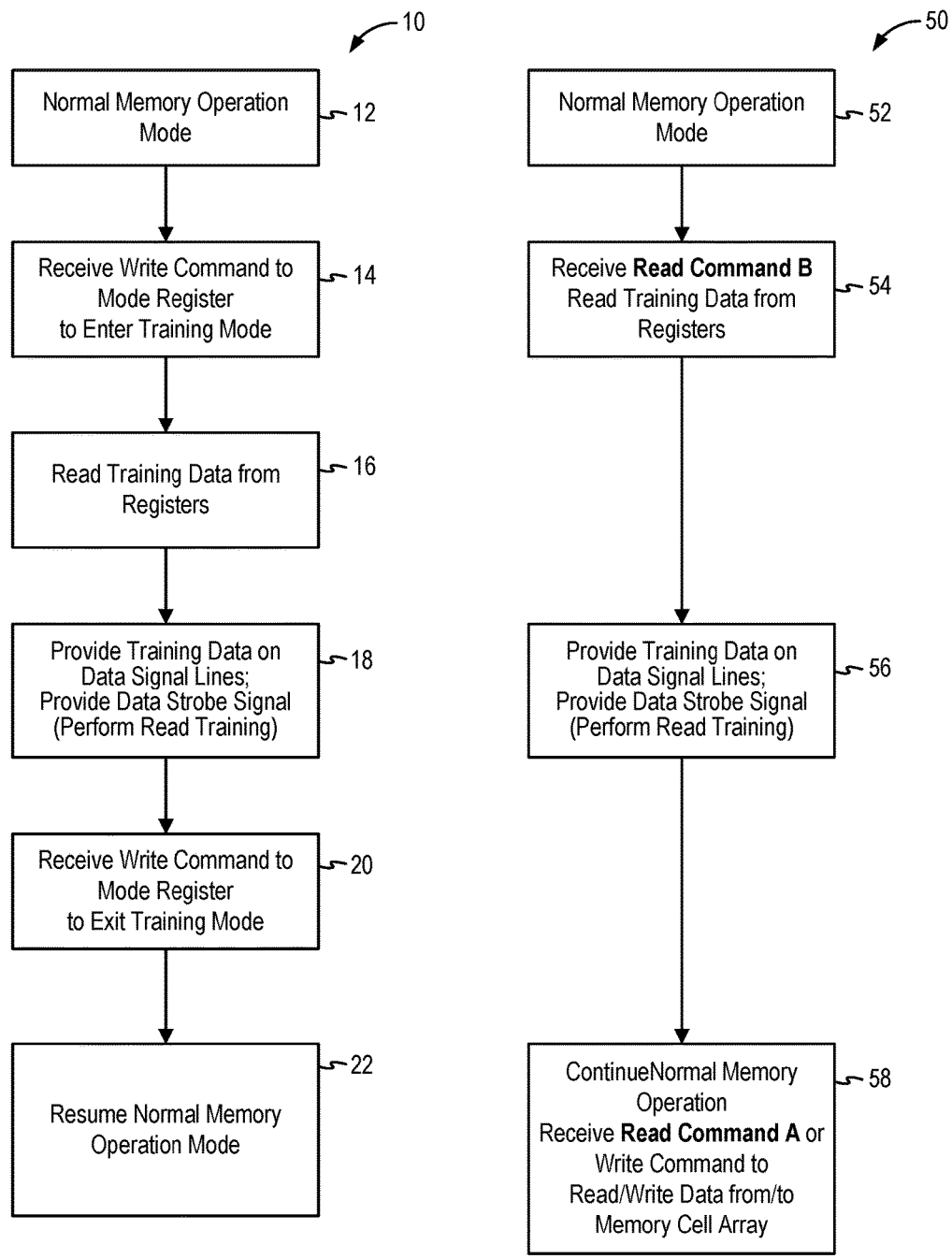
FIG. 1 is a flowchart illustrating the conventional memory read training method implemented in a memory device.
FIG. 2 is a flowchart illustrating the memory read training method implemented in a memory device in embodiments of the present invention.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a memory device implements a memory read training method using a dedicated read command to retrieve training data from a special register for performing memory read training while the memory device remains operating in the normal operation mode. Subsequent to the memory read training, the memory device may then receive the normal read command to read data from the memory cell array or the normal write command to write data to the memory cell array. In this manner, memory read training is performed simply by issuing read commands and carrying out read operations without requiring the memory device to enter and exit special memory read training mode for performing calibration. The memory device of the present invention enables data bus calibration to be performed efficiently to improve signal integrity. In some applications, a memory controller, in communication with the memory device, may perform memory read training by simply issuing the dedicated read command to the memory device while the memory device is operating in the normal operation mode.

In embodiments of the present invention, the memory read training method of the present invention can be applied to all types of memory devices that require memory read training for data strobe signal and data signal alignment. For example, in embodiments of the present invention, the memory read training method of the present invention can be applied to DRAMs, SRAMs, and Flash memories. In particular, in some embodiments, the memory read training method of the present invention is implemented in NOR Flash memory devices and especially in SPI NOR Flash memory devices or other types of serial flash devices.

In particular, the memory read training method of the present invention is applicable to memory devices that employ a data strobe signal (DQS) to accompany the data signal (DQ) to indicate the point at which the data signal should be sampled or captured. The data strobe signal functions as a reference signal or a clock signal for capturing the data bits of the data signal. In a memory system where the memory device communicates with a memory controller, the data strobe signal (DQS) is used to inform the memory controller when read data can be captured.

Specifically, in a read operation from the memory device, the memory device drives the data strobe signal and provides the read data on the data signal lines. In particular, during a read operation, the memory device drives the data strobe signal to a logical low level for a preamble period. The read data is provided after the preamble period and the data strobe signal then toggles with the read data. When reading data from the memory device, the data strobe signal edge transitions at the same time as the read data transitions. That is, the data strobe signal generated by the memory device in a read operation is edge-aligned with the data. The memory controller uses the data strobe signal as a reference signal to capture the read data being provided on the data signal lines whereby the data strobe signal is delayed to the center of read data to maximize the valid data window.

FIG. 1 is a flowchart illustrating the conventional memory read training method implemented in a memory device. Referring to FIG. 1, the conventional memory read training method starts when the memory device is operating in the normal memory operation mode (12). In the conventional memory read training method, to perform memory read training, the memory device has to be placed in a special memory read training mode. Placing the memory device in the special memory read training mode requires writing certain mode register on the memory device to a predefined value. Accordingly, the memory device receives a write command to write a first predefined value to the relevant mode register (14). For example, a memory controller, in communication with the memory device, issues the write command to the mode register to cause the memory device to enter the training mode. As a result of the mode register being written to the predefined value, the memory device is programmed to enter the training mode. In the training mode, the memory device reads training data, being a predefined data sequence, from a predefined register (16). The memory device provides the training data on the data signal lines (DQ) as read data output (18). Meanwhile, the data strobe signal DQS is generated and provided in conjunction with the read out data on the data signal lines DQ. The memory controller performs the training process to determine the desired delay offset to ensure the data strobe signal (DQS) aligns with the data signal (DQ). At the completion of the memory read training, the memory device has to exit the training mode. The memory device receives a write command to write a second predefined value to the relevant mode register to program the memory device to exit the training mode (20). With the mode register written to the second predefined value, the memory device then returns to normal memory operation to receive read commands or write commands to read or write data form/to the memory cell array (22).

The conventional memory read training method is undesirable because the method requires writing to special mode registers to put the memory device into the dedicated training mode and then writing to special mode registers to take the memory device out of the training mode. The conventional memory read training method is inefficient as the method requires the memory to keep changing operation mode—from normal memory operation to training mode operation and then out of training mode operation.

In embodiments of the present invention, a memory read training method is implemented in a memory device to enable memory read training to be performed without requiring the memory device to exit from normal memory operation and without requiring the memory device to enter into or exit out of any dedicated training mode. The memory read training method enables memory read training to be performed while the memory device remains in the normal memory operation mode. More specifically, the memory read training method defines two read commands for the memory device. A first read command, denoted as "Read Command A", is the normal read command for the memory device and is used to read memory data from the memory cell array. A second read command, denoted as "Read Command B", is a dedicated read command used to read memory data from a register storing a predefined data sequence as the training data. Accordingly, the memory read training method of the present invention uses the dedicated read command—Read Command B—to cause the memory device to read out the training data when memory read training is to be performed. The memory device can continue normal memory operation simply by receiving the normal read command (Read Command A) or a write command following the memory read training. The memory device does not change operation mode and there is no need to perform any writing to special register in order to enter or exit any special training mode.

FIG. 2 is a flowchart illustrating the memory read training method implemented in a memory device in embodiments of the present invention. Referring to FIG. 2, a memory read training method 50 is implemented in a memory device to facility memory read training. The memory read training method 50 starts with the memory device operating in the normal memory operation mode (52). In the present description, normal memory operation or normal memory operation mode refers to the memory device being configured to read data from or write data to the memory cell array. The memory read training method 50 of the present invention performs memory read training with the memory device in the normal memory operation mode and does not require the memory device to enter into any dedicated training mode.

To perform memory read training, the memory device receives the dedicated read command—the Read Command B (54). In response to receiving the Read Command B, the memory device read out training data that is stored in a register. The memory device provides the training data on the data signal lines (DQ) as read out data (56). Meanwhile, the data strobe signal DQS is generated and provided in conjunction with the read out data on the data signal lines DQ. The memory controller, in communication with the memory device, performs the training process to determine the desired delay offset to ensure the data strobe signal (DQS) aligns with the data signal (DQ). In one embodiment, the training data is a training data sequence of a given bit length and the memory device provides the training data sequence and the data strobe signal repeatedly until the memory read training is completed. At the completion of the memory read training, the memory device continues normal memory operation by receiving the normal read command (Read Command A) or the write command to perform read and write operation to the memory cell array (58).

The memory read training method 50 of the present invention is advantageous to enable memory read training to be invoked in the memory device by issuing the Read Command B to the memory device to read out the training data. The memory device remains in the normal memory operation mode and memory read training can be performed easily without having to write to special registers and to enter or exit dedicated training mode.

Figure 3:
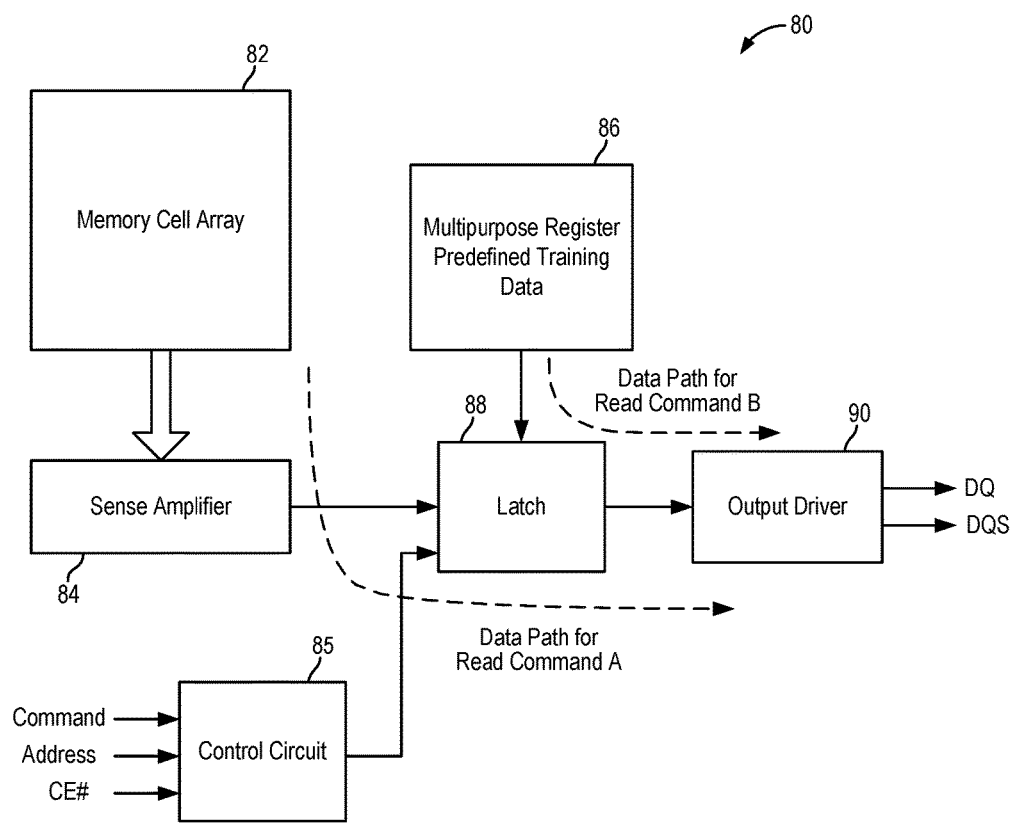
FIG. 3 is a schematic diagram of a memory device in which the memory read training method can be implemented in embodiments of the present invention.

FIG. 3 is a schematic diagram of a memory device in which the memory read training method can be implemented in embodiments of the present invention. Referring to FIG. 3, a memory device 80 includes a memory cell array 82 for storing memory data. A sense amplifier 84 is coupled to the memory cell array 82 to facilitate the read out of stored memory data from the array. To support memory read training, the memory device 80 includes a register 86 configured to store predefined training data for use in memory read training. In some embodiments, the register 86 is part of a set of multi-purpose registers in the memory device 80. The register 86 and the sense amplifier 84 are both coupled to a latch circuit 88. The latch circuit 88 is under the control of a control logic circuit 85 to select a specific data path for reading out data to an output driver 90. The output driver 90 generates the data strobe signal DQS and provides the read out data on the data signal DQ.

The control logic circuit 85 receives control signals for the memory device 80. In the present example, the control logic circuit 85 receives the command input, the address input and a chip enable (CE) signal. In some cases, the command and address input share the same input data lines. In other embodiments, the control logic circuit 85 of the memory device 80 may receive other control input signals not shown in FIG. 3 for simplicity. The control logic circuit 85 controls the operation of the memory device 80 and generates control signals for various circuit elements in the memory device. In the present illustration, the control logic circuit 85 is shown configured to control the latch circuit 88 to select a specific data path in response to the read command being received.

The construction of memory device 80 in FIG. 3 is illustrative only and is not intended to be limiting. In particular, FIG. 3 illustrates components of the memory device 80 for performing read operations in the memory device. The memory device 80 includes additional circuit components not shown to support operational functions of the memory device. For example, the memory device 80 may include a write driver coupled to the memory cell array 82 to facilitate writing of write data into the memory array. In another example, the data strobe signal DQS and data signal lines DQ are bidirectional signals and the memory device 80 may receive an input buffer for receiving incoming write data on the data signal lines DQ and the inputting data strobe signal DQS as a reference signal to indicate when to capture the write data.

As thus configured, the memory device 80 performs normal memory operation by receiving commands and addresses to read data from and write data to the memory cell array 82. In particular, in response to receiving the Read Command A for a normal read operation, the control logic circuit 85 instructs the latch circuit 88 to select the read data from the sense amplifier. The stored memory data from the memory cell array 82 corresponding to the input address is retrieved and provided through the latch circuit 88 to the output driver 90 as read out data.

When memory read training is to be performed, the memory device 80 receives the Read Command B. For example, the memory controller coupled to the memory device 80 may issue the Read Command B to the memory device 80. In response to receiving the Read Command B, the control logic circuit 85 instructs the latch circuit 88 to select the read data from the register 86. The stored training data from the register 86 is retrieved and provided through the latch circuit 88 to the output driver 90 as read out data. In this manner, the memory device 80 provides the predefined data sequence on the data signal lines DQ as the read out data and the memory controller may perform the memory read training to determine the delay offset to use for the data strobe signal DQS. Importantly, the memory device 80 remains in normal memory operation mode while providing the training data for memory read training. In one embodiment, the training data sequence is provided repeatedly until the memory read training is completed. The memory controller may indicate completion of the memory read training by deasserting the chip enable signal or by issuing a normal read command (Read Command A) or a write command for reading or writing to the memory cell array 82.

In some embodiments, the read command is a 1 byte (8-bit) command. The memory read training method of the present invention defines an additional read command for the memory device to read the training data from the register. For example, a NOR flash memory device typically has a command set of 50-60 commands. The memory read training method of the present invention defines one more command to the command set to enable memory read training in normal memory operation.

Figure 4:
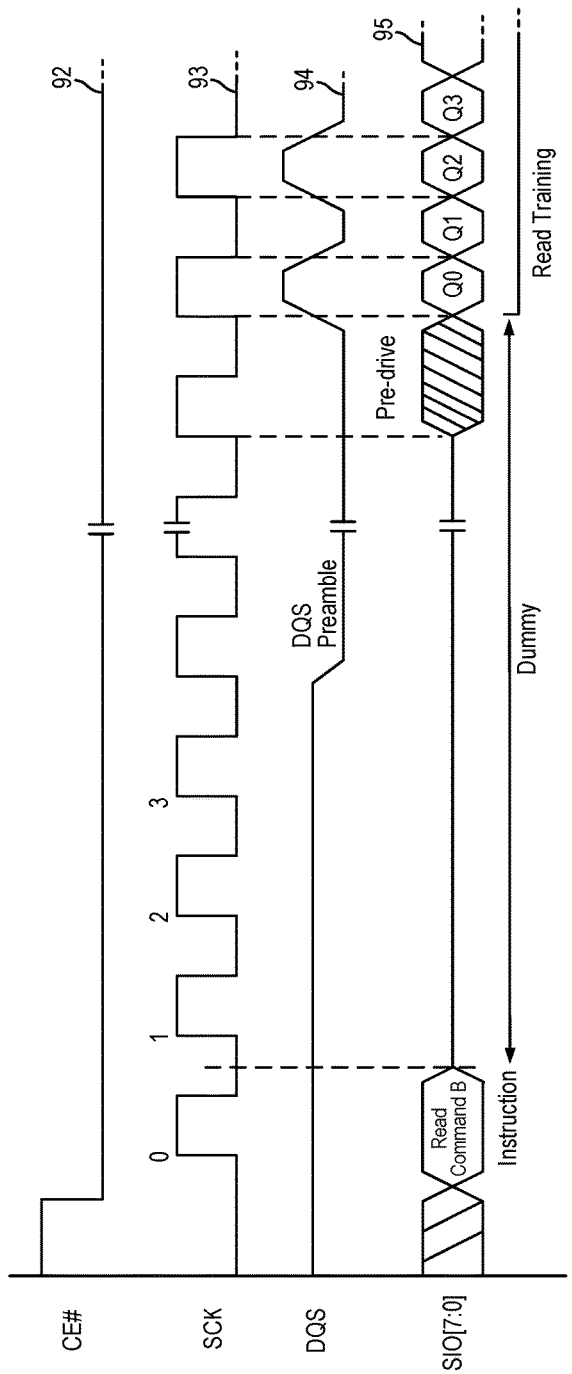
FIG. 4 is a timing diagram illustrating the memory read training method in a serial memory device in some embodiments.

FIG. 4 is a timing diagram illustrating the memory read training method in a serial memory device in some embodiments. In the serial memory device, commands and data are received or provided serially on the same data bus SIO. In the present embodiment, the serial data bus SIO is an 8-bit serial data bus SIO[7:0] (curve 95). Referring to FIG. 4, the memory device is enabled when the active-low chip enable signal CE# is asserted low (curve 92). Furthermore, the memory device operates under the system clock signal SCK (curve 93) and the data strobe signal DQS is normally in a high impedance state to allow either the memory device or the memory controller to drive the signal in read or write operations.

In response to the memory device receiving a Read Command B on the serial data bus SIO, the memory device, after a few clock cycles, drives the data strobe signal DQS to a logical low level. The data strobe signal DQS remains at the logical low level for a preamble period. Then, as the training data is retrieved form the register, the memory device drives the serial data bus SIO to provide the training data onto the serial data bus SIO. The data strobe signal DQS toggles with the data signal as the training data Q0 to Q3 are being read out onto the data bus SIO. In this manner, as a result of providing the Read Command B to the memory device, read training can be performed using the data strobe signal DQS and the training data thus provided from the memory device.

In the present embodiment, the training data is repeatedly driven onto the serial data bus SIO until the chip enable signal CE# is asserted high or until the next command is received with the chip enable signal CE# remaining low. No register writing is required to continue operating the memory device after memory read training is completed.

Figure 5:
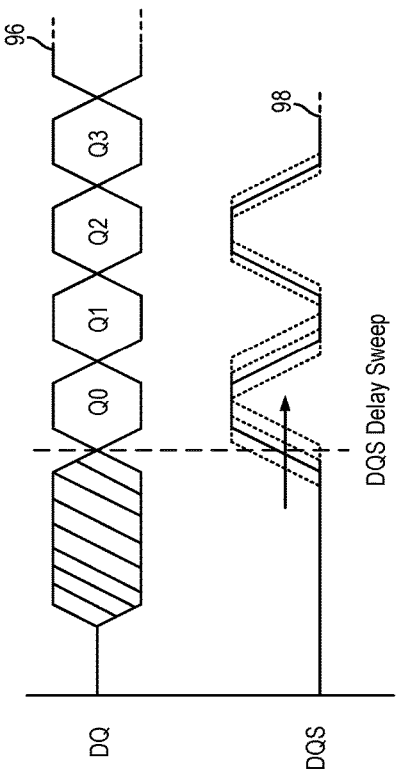
FIG. 5 illustrates the process at the memory controller to perform memory read training in some example.

FIG. 5 illustrates the process at the memory controller to perform memory read training in some example. Referring to FIG. 5, the memory controller receives the training data as data signals DQ (curve 96) from the memory device. The training data is a known data sequence to the memory controller. The memory controller also receives the data strobe signal DQS (curve 98) from the memory device. The memory controller sweeps the DQS signal through its delay range. For example, the memory controller may adjust the delay of the data strobe signal DQS one step at a time until the memory controller detects a zero-one transition on the sampled data signal. The delay step that achieves this transition results in the alignment of the data strobe DQS and the data signal DQ at the memory controller. Accordingly, the memory controller can determine the delay offset to apply to ensure that the data strobe DQS aligns with the data signal DQ to ensure robust read operation with the memory device.

The memory read training method of the present invention realizes many advantages over conventional memory read training method. First, the memory read training method of the present invention achieves simplicity of training where the training operation is simplified by mere issuance of a read command. In contrast, the conventional memory read training method requires writing to mode registers of the memory device and entering and exiting dedicated memory read training mode. Using the memory read training method of the present invention, the memory controller can perform memory read training easily and efficiently. The time required to perform memory read training is reduced as the need to enter and exit dedicated training mode is eliminated.

Second, the memory read training method of the present invention improves signal integrated and training accuracy by enabling training data to be provided while the memory device remains in normal memory operation. The memory read training method provides flexibility by enabling predefined training data sequence to be read out using one read command and stored memory data in the memory cell array to be read out using another read command. Thus, a memory controller is provided with flexibility in training by using the training data from the register or data stored in the memory cell array. The accuracy of the memory read training can thus be improved.

Third, the memory read training method of the present invention enables the training data sequence to be read out repeatedly until training is completed. In this manner, the memory controller has sufficient time to complete the training sequence for the memory device.

Lastly, the memory read training method of the present invention eliminates the delay between the end of training and resuming normal memory operation. At the end of memory read training, the memory device has to merely change the data path to read from the cell array and normal memory operation continues. The conventional memory read training method would require writing to the mode register to change the operation mode of the memory device, causing a delay in resuming normal memory operation.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for performing memory read training in a memory device, comprising:
    providing a memory cell array in the memory device configured to store memory data, the memory cell array being coupled to a sense amplifier to read out stored memory data;
    providing a register in the memory device configured to store training data;
    in response to the memory device operating in a normal memory operation mode, receiving a first read command indicative of reading training data from the register;
    in response to receiving the first read command, selecting a first data path to retrieve the training data stored in the register while remaining in the normal memory operation mode;
    providing the training data as read out data on data signal lines of the memory device;
    providing, with the read out data, a data strobe signal; and
    in response to receiving an indication of completion of the memory read training, continuing normal memory operations.

2. The method of claim 1, wherein the training data comprises a data sequence of a first bit length and the method further comprises:
    repeatedly providing the training data sequence and the data strobe signal until the indication of completion of the memory read training is received.

3. The method of claim 1, wherein, in response to receiving the indication of completion of the memory read training, continuing normal memory operations comprises:
    receiving a second read command as the indication of completion of the memory read training, the second read command indicative of reading memory data from a memory cell array of the memory device;
    in response to receiving the second read command, selecting a second data path to retrieve the memory data from the memory cell array;
    providing the memory data as read out data on data signal lines of the memory device; and
    providing, with the read out data, the data strobe signal.

4. The method of claim 1, wherein, in response to receiving the indication of completion of the memory read training, continuing normal memory operations comprises:
    receiving a write command as the indication of completion of the memory read training, the write command indicative of writing memory data to the memory cell array of the memory device;
    receiving write data with the data strobe signal; and
    in response to receiving the write command, capturing, using the data strobe signal, the write data and writing the write data to the memory cell array.

5. The method of claim 1, wherein, in response to receiving the indication of completion of the memory read training, continuing normal memory operations comprises:
    receiving deassertion of a chip enable signal of the memory device.

6. A method for performing memory read training in a memory device, comprising:
    providing a memory cell array in the memory device configured to store memory data, the memory cell array being coupled to a sense amplifier to read out stored memory data;

providing a register in the memory device configured to store training data;

in response to the memory device operating in a normal memory operation mode, receiving a first read command indicative of reading training data from a register;

in response to receiving the first read command, selecting a first data path to retrieve the training data stored in the register while remaining in the normal memory operation mode;

providing the training data as read out data on data signal lines of the memory device;

providing, with the training data, a data strobe signal;

receiving a second read command indicative of reading memory data from a memory cell array of the memory device;

in response to receiving the second read command, selecting a second data path to retrieve the memory data from the memory cell array;

providing the memory data as read out data on data signal lines of the memory device; and providing, with the memory data, the data strobe signal.

7. The method of claim 6, wherein the training data comprises a data sequence of a first bit length and the method further comprises:

repeatedly providing the training data sequence and the data strobe signal until the second read command is received.

8. A memory device, comprising:

a memory cell array configured to store memory data, the memory cell array being coupled to a sense amplifier to read out stored memory data;

a register configured to store training data;

a latch circuit configured to select one of a first data path of training data from the register and a second data path of memory data from the sense amplifier;

an output driver coupled to the latch circuit to receive data from a selected data path and to provide the selected data as read out data on data signal lines with a data strobe signal; and a control circuit configured to receive commands and to control the latch circuit, wherein in response to the memory device operating in a normal memory operation and the control circuit receiving a first read command, the control circuit is configured to control the latch circuit to select the first data path, and the output driver provides the training data as read out data on data signal lines with the data strobe signal.

9. The memory device of claim 8, wherein in response to receiving an indication of completion of the memory read training, the control circuit continues normal memory operations.

10. The memory device of claim 9, wherein the training data comprises a data sequence of a first bit length and the output driver repeatedly provides the training data sequence and the data strobe signal until the indication of completion of the memory read training is received.

11. The memory device of claim 8, wherein in response to receiving a second read command, the control circuit is configured to control the latch circuit to select the second data path, and the output driver provides the memory data as read out data on the data signal lines with the data strobe signal.

12. The memory device of claim 9, wherein the indication of completion of the memory read training comprises a write command for writing write data into the memory cell array.

13. The memory device of claim 9, wherein the indication of completion of the memory read training comprises a chip enable signal being deasserted.

\* \* \* \* \*